United States Patent [19]

Yeh

[11] Patent Number: 5,822,457
[45] Date of Patent: Oct. 13, 1998

[54] PRE-CODING METHOD AND APPARATUS FOR MULTIPLE SOURCE OR TIME-SHIFTED SINGLE SOURCE DATA AND CORRESPONDING INVERSE POST-DECODING METHOD AND APPARATUS

[75] Inventor: Pen-Shu Yeh, Silver Spring, Md.

[73] Assignee: The United States of America as represented by the Administrator of the National Aeronautics and Space Administration, Washington, D.C.

[21] Appl. No.: 967,780

[22] Filed: Nov. 10, 1997

Related U.S. Application Data

[62] Division of Ser. No. 370,583, Jan. 3, 1995, Pat. No. 5,687,255.

[51] Int. Cl.$^6$ ........................................... G06K 9/36
[52] U.S. Cl. ................ 382/332; 364/715.02; 364/736.01
[58] Field of Search ..................................... 382/232, 233, 382/236, 238; 358/430; 348/409, 415, 438; 341/76; 364/715.02, 736.01, 768; 235/61 FE

[56] References Cited

U.S. PATENT DOCUMENTS

| | | | |
|---|---|---|---|
| 4,602,333 | 7/1986 | Komori | 364/414 |
| 5,177,796 | 1/1993 | Feig et al. | 382/56 |
| 5,448,642 | 9/1995 | Yeh | 382/232 |

FOREIGN PATENT DOCUMENTS

| | | | |
|---|---|---|---|
| 60-186971 | 9/1985 | Japan | 382/236 |

Primary Examiner—Andrew W. Johns

[57] ABSTRACT

A pre-coding method and device for improving data compression performance by removing correlation between a first original data set and a second original data set, each having M members, respectively. The pre-coding method produces a compression-efficiency-enhancing double-difference data set. The method and device produce a double-difference data set, i.e., an adjacent-delta calculation performed on a cross-delta data set or a cross-delta calculation performed on two adjacent-delta data sets, from either one of (1) two adjacent spectral bands coming from two discrete sources, respectively, or (2) two time-shifted data sets coming from a single source. The resulting double-difference data set is then coded using either a distortionless data encoding scheme (entropy encoding) or a lossy data compression scheme. Also, a post-decoding method and device for recovering a second original data set having been represented by such a double-difference data set.

9 Claims, 18 Drawing Sheets

{Cross-Delta Single Difference}

{Adjacent-Delta Single Difference}

{ Double-Difference, Adjacent + Cross }

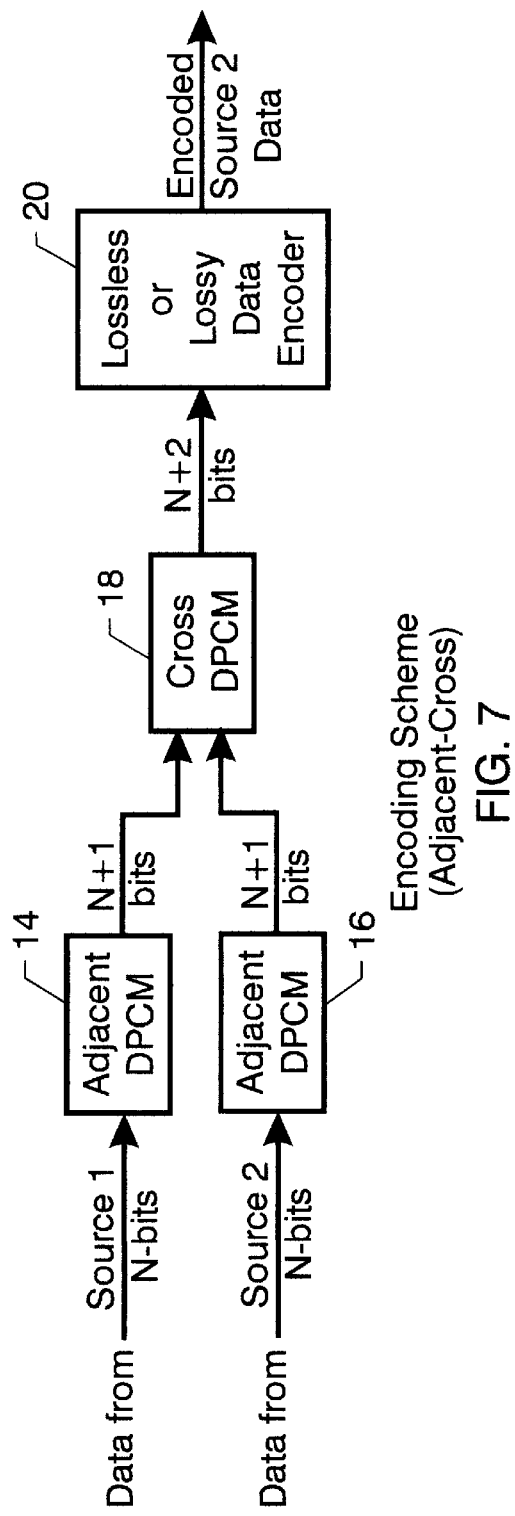
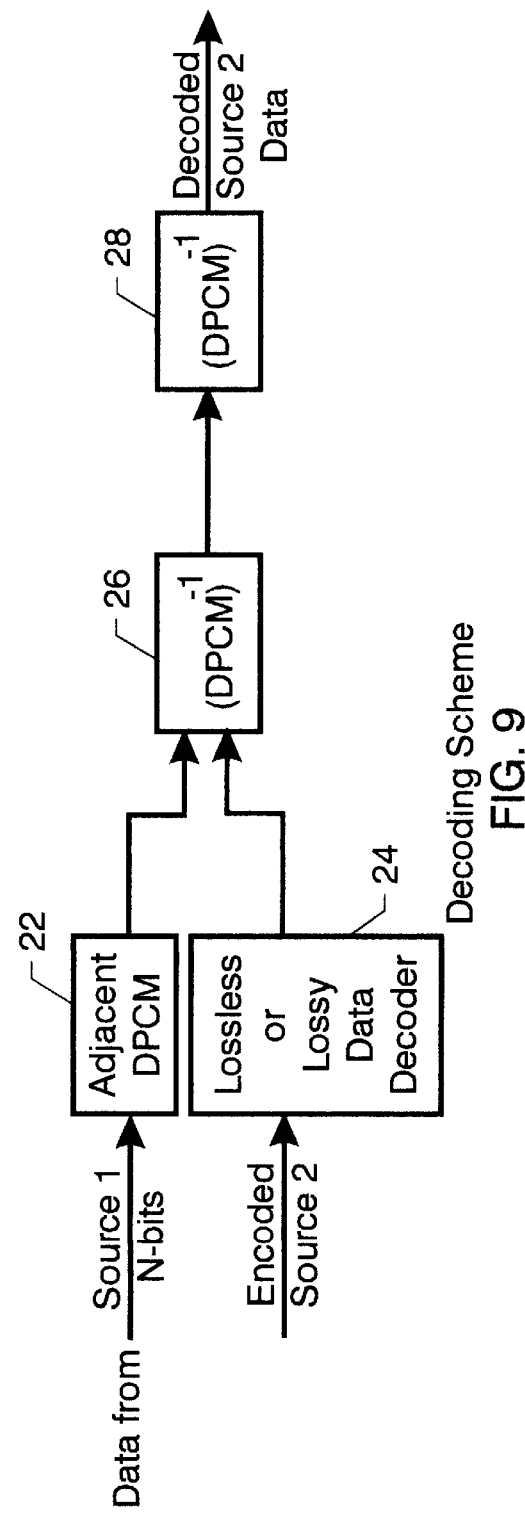

{ Inverse of Fig. 6 }

$$\begin{bmatrix} \text{Double-Difference,} \\ \text{Cross+Adjacent} \end{bmatrix}$$

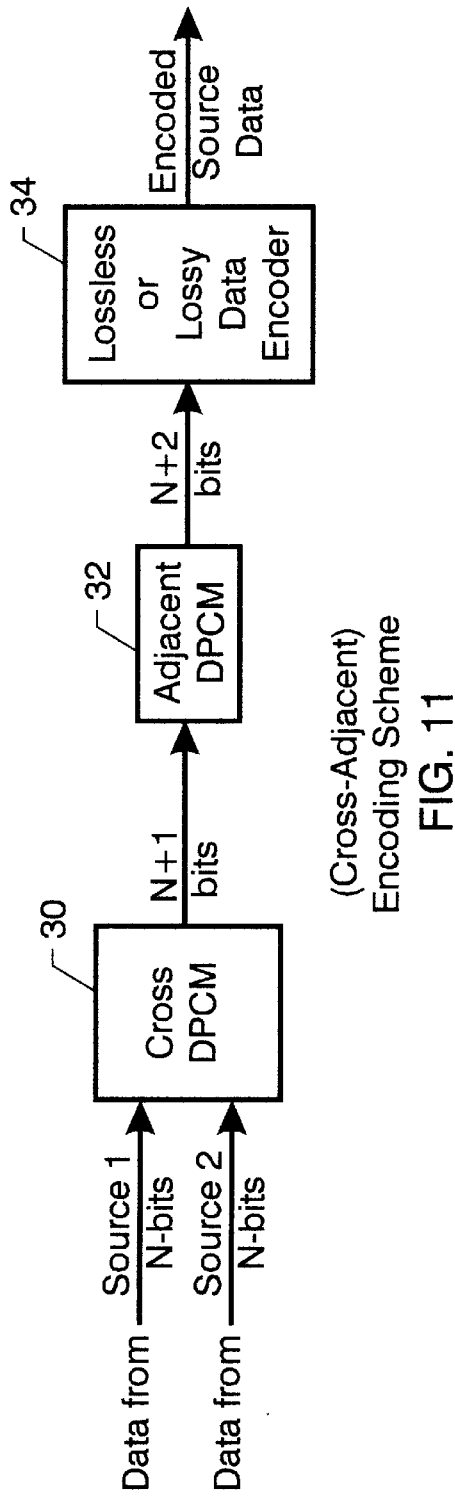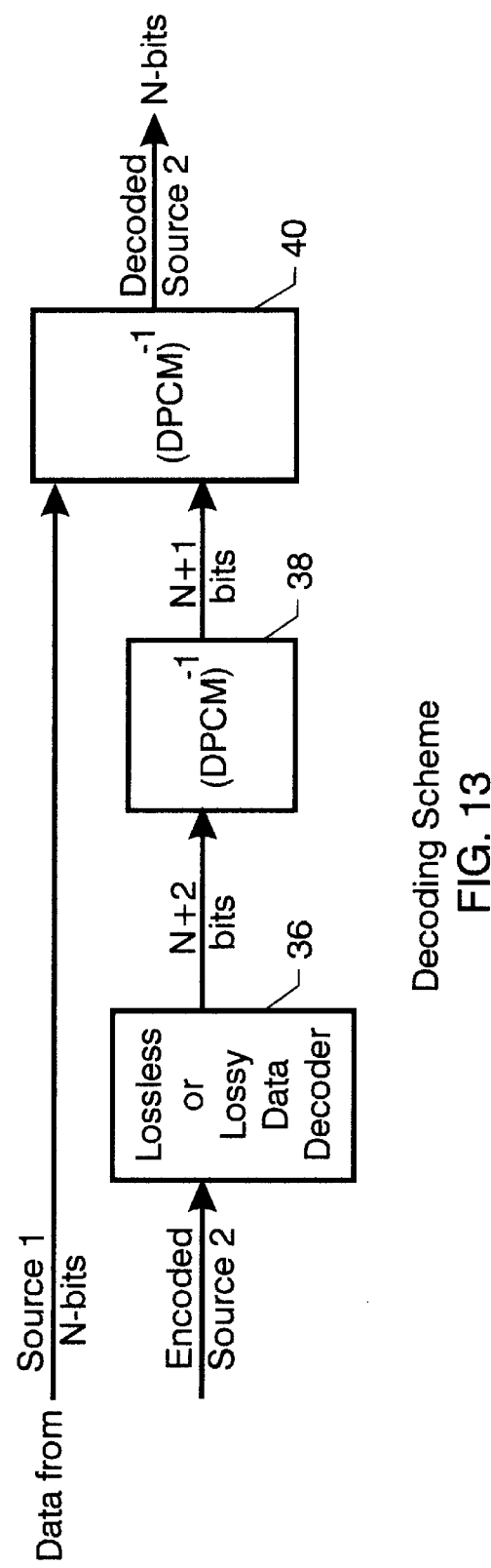

[ Inverse of Fig. 10 ]

Multi-source Encoder Architecture

Multi-source Decoder Architecture

Preferred hardware embodiment for the two DPCM blocks

Preferred hardware embodiment for the two inverse DPCM blocks in the data reconstruction operator

PRE-CODING METHOD AND APPARATUS FOR MULTIPLE SOURCE OR TIME-SHIFTED SINGLE SOURCE DATA AND CORRESPONDING INVERSE POST-DECODING METHOD AND APPARATUS

This application is a division of application Ser. No. 08/370,583, filed Jan. 3, 1995, now U.S. Pat. No. 5,687,255.

ORIGIN OF THE INVENTION

The invention described herein was made by an employee of the United States Government, and may be manufactured and used by or for the Government for governmental purposes without the payment of any royalties thereon or therefor.

CROSS-REFERENCES TO RELATED APPLICATIONS

The present application involves subject matter relating to co-pending application Ser. No. 07/881,575, entitled, "Method for Encoding Low Entropy Data," filed in the name of Pen-Shu Yeh, the present inventor, on May 12, 1992. The above-noted related application is assigned to the assignee of the present invention. Moreover, the teachings of this related application are herein meant to be incorporated by reference.

BACKGROUND OF THE INVENTION

1. Field of the Invention

The present invention relates to a pre-compression-coding method that improves data compression performance by removing correlation between a first original data set and a second original data set.

2. Description of the Prior Art

In general, data compression reduces an amount of data to be stored or transmitted by removing the correlation and redundancy in the data and representing efficiently the remaining information with codewords. An optimal compression coding scheme will give an expected codeword length close to the information measure, a figure of merit referred to as entropy, in the original data. An example of such a coding scheme is the Huffman code. In addition, there are encoding schemes that produce expected codeword lengths shorter than the information measure in the original data. Such schemes are referred to as lossy data compression because the reconstructed data will be distorted from the original data. The prior art performs data compression, for the most part, on data obtained from a single source (producing a single spectral band), using either a distortionless or lossy technique.

Advances in sensor technology have allowed new data collection schemes which generate plural data sets simultaneously from multiple sources. Such plural data sets include imaging data from multiple spectral bands, often referred to as multispectral data, and spectral distributions from a radio frequency source sampled at different times, i.e., time-shifted.

An example of multispectral sensor data is the data collected from the Thematic Mapper on the Landsat spacecraft. The Landsat program was initiated for the study of the Earth's surface and resources in the 1970's. Landsat-1, Landsat-2, and Landsat-3 were launched between 1972 and 1978. Landsat-4 was launched in 1982, and Landsat-5 in 1984. The Thematic Mapper on Landsat-4 and -5 collected data in six spectral bands; (1) D. R. Sloggett, *Satellite data: processing, archiving and dissemination, Vol. 1, Applications and infrastructure*, published by Ellis Horwood Limited, distributed by Halsted Press, a division of John Wiley & Sons, 1989, and (2) P. S. Yeh and W. H. Miller, "Application guide for universal source encoding for space," NASA Technical Paper 3441, December 1993. An example of a spectral distribution sampled at different times is the Acousto-Optical Spectrometer ("AOS") on the Submillimeter Wave Astronomy Satellite ("SWAS") which is to be launched in 1995. The AOS sensor collects the radio-frequency spectrum of galactical molecular clouds at different times to observe changes; G. Chin, "Optically pumped submillimeter laser heterodyne receivers: astrophysical observations and recent technical developments," *Proceedings of the IEEE*, Vol. 80, No. 11, November, 1992. Such data is useful to scientific investigation and earth resource monitoring, yet it presents problems in terms of data transmission, processing, and storage because of the large amounts of original data generated.

Modern imaging sensors, whose uses include scientific studies in the areas of astronomy, earth resources, or commercial applications such as high definition TV, typically produce data samples which are quantized into, for example, 8 or 12 bits/sample. As shown in FIG. 1, an 8-bit word can represent 256 pixel intensity values. Typically, the intensities in a set of image data are not evenly distributed, but rather are concentrated in one or a few small ranges.

Such image data can have an actual information content that is much lower than the given quantization level is capable of representing. In terms of representing information content, an image's typically low information content results in unused capacity, i.e., extra bits beyond those required for the given information content. Data compression has as one of its objectives adaptively matching a minimal length codeword to particular information content, to thereby minimize unused capacity. In general, this involves converting the original data into another form of digital representation, which then reduces the total data rate significantly because the length of the codewords, i.e., the number of bits per codeword, adaptively tracks the information content.

The prior art has exploited information correlation among multi-source data sets, i.e., multispectral data, mainly by using lossy encoding techniques which involve a complicated transformation of the data into a different domain. A simple data information content prediction scheme using a data set from a neighboring spectral band has not performed well.

The prior art has attempted to use a distortionless pre-coding scheme involving a simple single subtraction of corresponding members of a second original data set from a first original data set. As shown in FIG. 2, data set 1 ($a_0$, $a_1$, $a_2$, $a_3$), item 10, is subtracted from data set 2 ($b_0$, $b_1$, $b_2$, $b_3$), item 10, to form what is referred to as a cross-delta data set. Prediction using such a cross-delta data set has not significantly enhanced compression efficiency because, for example, the material under observation exhibits significantly different spectral properties among the original data sets, respectively, or because the material under observation has undergone a significant change during the time elapsed between the sampling that produced the first data set and the sampling that produced the second data set, despite the data sets sharing the same frequency spectrum.

As an alternative, as shown in FIG. 3, the prior art has attempted to employ a simple single adjacent data pre-coding technique in which adjacent members within each single data set 10 and 12 are subtracted from one another to produce what is referred to as an adjacent-delta data set, respectively. FIG. 4 depicts a plot of the distribution of delta values for either the cross-delta or adjacent-delta technique, taken alone.

The known multi-source encoding scheme applies a Karhunen-Loève transform to data from each source, followed by further processing and encoding. This technique is inherently lossy because of the precision required in computing the transforms. Also, the procedure suffers the problem that it requires a tremendous amount of computation.

Accordingly, a need exists for a simple method that improves data compression efficiency by exploiting information correlation among multi-source, or time-shifted, data sets.

SUMMARY OF THE INVENTION

It is an object of the present application, therefor, to improve data compression.

It is a further object to improve data compression efficiency by exploiting information correlation among multi-source, or time-shifted single source, data sets.

These and other objects of the present invention are fulfilled by providing a pre-compression-coding method and device that produce a double-difference data set, i.e., an adjacent-delta calculation performed on two cross-delta data sets or a cross-delta calculation performed on two adjacent-delta data sets on one of (1) two adjacent spectral bands coming from two discrete sources, respectively, and (2) two time-shifted data sets from a single source. The resulting double-difference set is then coded using either a distortion-less data encoding scheme (entropy encoding) or a lossy data compression scheme.

Further, these and other objects of the present application are fulfilled by providing a method and device for reconstructing a second original data set, the second original data set having been represented by a double-difference data set due to a double difference calculation upon the second original data set and a first original data set.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 is an alternative depiction of the double-difference calculation shown in FIG. 6;

FIG. 9 is an alternative depiction of the reconstruction calculation shown in FIG. 8;

FIG. 11 is an alternative depiction of the double-difference calculation of FIG. 10;

FIG. 13 is an alternative depiction of the reconstruction calculation shown in FIG. 12.

DETAILED DESCRIPTION OF THE PREFERRED EMBODIMENTS

The preferred embodiments of the present application improve data compression performance by a pre-compression-coding scheme that produces a double-difference data set, this double-difference set being the object of subsequent compression.

Figure 6:
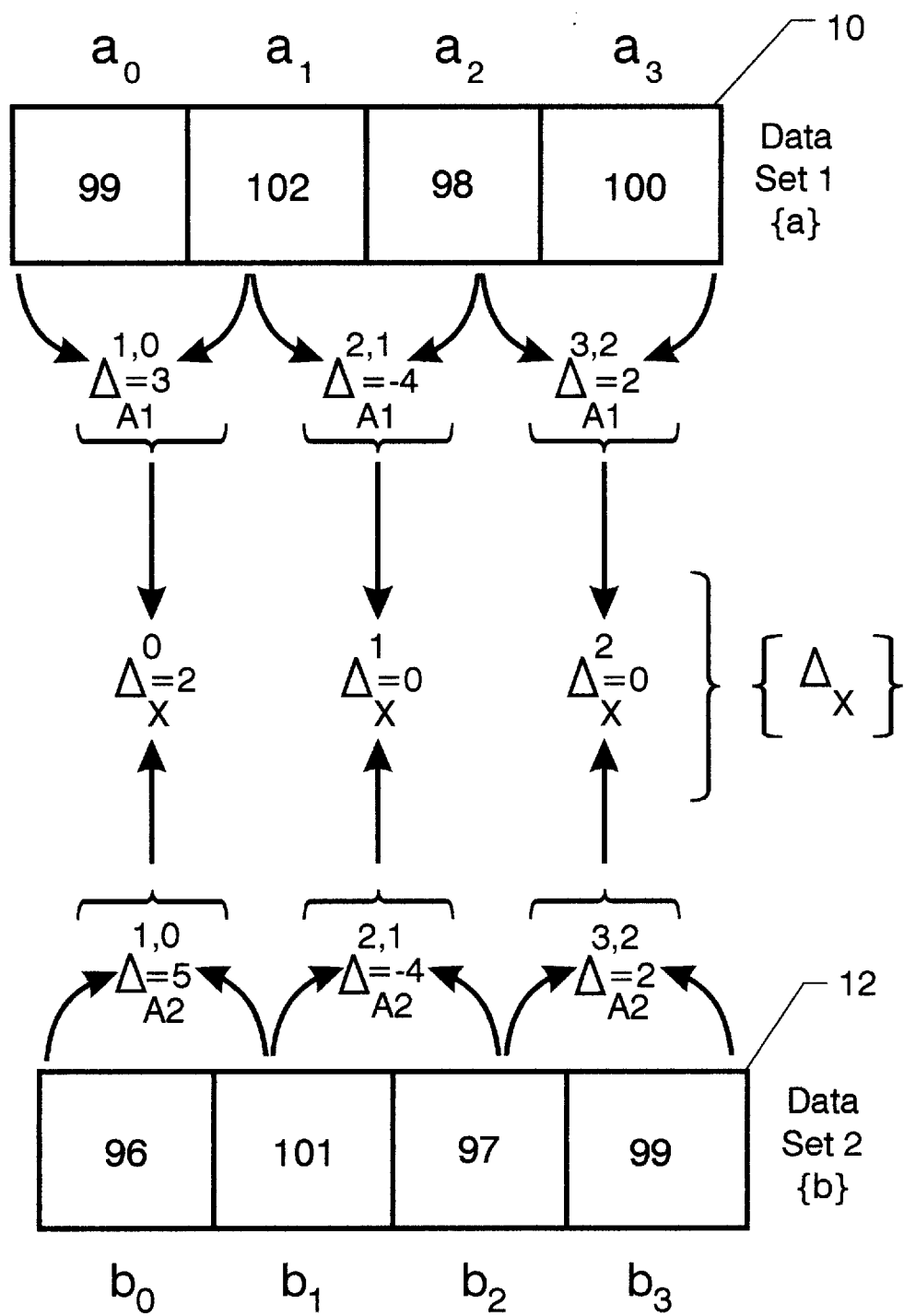
FIG. 6 depicts a double-difference calculation in the form of a cross-delta calculation performed on two discrete adjacent-delta data sets.

Referring now to the drawings, FIG. 6 depicts a first type of double-difference calculation in which an adjacent-delta set data is formed for each of original data sets 10 and 12 by subtracting adjacent members of the data set from each other, respectively. Then, a cross-delta data set is formed by subtracting corresponding members of the first adjacent-delta data set from the second adjacent-delta data set to produce a cross-delta data set, i.e., the double-difference data set.

In more detail regarding FIG. 6, the adjacent-delta value for members zero and one of set 1, $\Delta_{A1}^{1,0}=3=a_1-a_0=102-99$. Similarly, $\Delta_{A1}^{2,1}=-4=98-104$ and $\Delta_{A1}^{3,2}=2=100-98$. For the adjacent delta value for members zero and one of set 2, $\Delta_{A2}^{1,0}=5=b_1-b_0=101-96$. Similarly, $\Delta_{A2}^{2,1}=-4=97-101$ and $\Delta_{A2}^{3,2}=2=99-97$. For the cross-delta value for the zero$^{th}$ corresponding members of the adjacent-delta data sets, $\Delta_x^0=2=\Delta_{A2}^{1,0}-\Delta_{A1}^{1,0}=5-3$. Similarly, $\Delta_x^1=0=-4-(-4)$ and $\Delta_x^2=0=2-2$.

FIG. 7 depicts a block diagram of the double-difference calculation of FIG. 6. Hereafter, the differencing operation will also be referred to as Differential Pulse Code Modulation, as performed by a Differential Pulse Code Modulator (DPCM) with a linear quantizer. A DPCM 14 receives N-bits per word data from source 1 and outputs N+1 bit data to a DPCM 18. The DPCM 14 and 16 each produce an adjacent-delta data set. Another DPCM 16 receives N-bit data from source 2 and outputs N+1 bit data to the DPCM 18. The DPCM 18 produces an N+2 bits per word cross-delta data set therefrom and outputs it as a double-difference data set to a distortionless or lossy data encoder 20, which then outputs encoded, i.e., compressed, data from source 2. For an inputted original data set formed of N-bit words, the DPCM processor will produce (N+1) bit words having both positive and negative values, hence the need for an additional bit.

The function of the preferred embodiments is to compute a double-difference between original data sets taken from distinct sources or original data sets taken from a single source, albeit sampled at different points in time (time-shifted). The DPCM is basically a prediction device that results in a prediction error. For example, for two adjacent data sources producing two adjacent spectral bands (neighboring bands in the frequency spectrum), an adjacent-delta data set made from a first one of the original data sets is used as a predictor for the adjacent-delta data sets in the other original data set. The prediction error is then coded using either a distortionless or lossy compression scheme, such compression schemes may require that the input data values be non-negative integers. In such a circumstance, a signal conditioning procedure that adds a value of $2N+1-1$ to all data values to be compressed can be included.

This prediction scheme is based on the observation that in any data set, information resides at the point where changes occur, i.e., at an edge. No information exists if all members of the data set are of the same value, i.e., where there are no edges. The DPCM 14, FIG. 7, effectively removes any background shifts and retains the edge (change) information in the data set from a particular data source.

When material under observation produces different original data sets for different data sources (such as multiple spectral bands), it is likely that the change in edge information is smaller across spectral bands (i.e., between neighboring bands) than within a particular spectral band. This smaller change in edge information provides the improvement in cross-spectral band data compression over the prior art single spectral band compression. The DPCM 18 reveals such smaller changes in its output.

Figure 8:
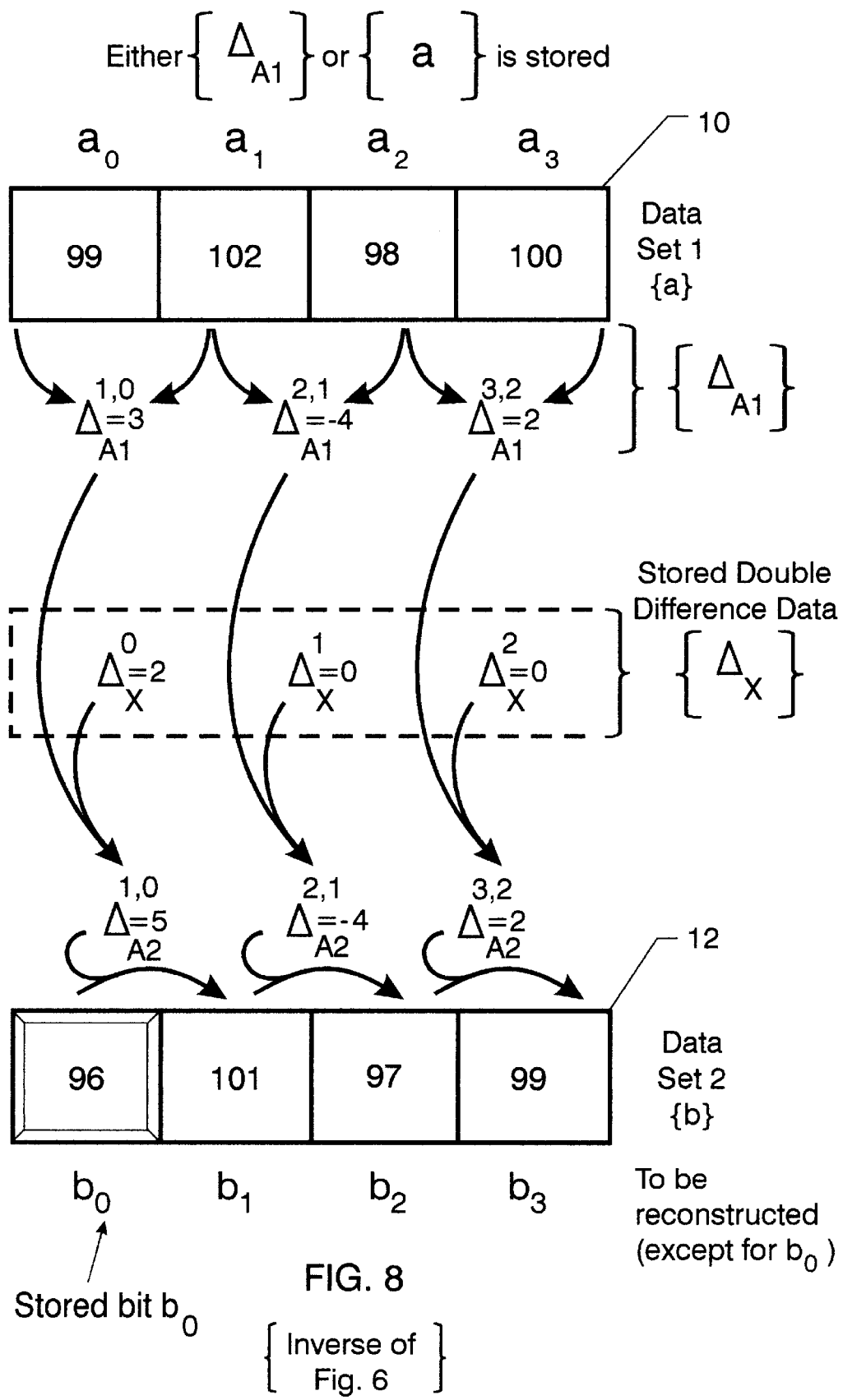
FIG. 8 depicts a reconstruction calculation, i.e., the inverse calculation to the double-difference calculation depicted in FIG. 6.

FIG. 8 depicts a reconstruction calculation, i.e., the inverse calculation to the double-difference calculation depicted in FIG. 6, that reconstructs the second original data set. Certain information is stored after the double difference calculation of FIG. 6 is completed: (1) the double-different data set $\{\Delta_x\}$; (2) the zero$^{th}$ member of the second original data set, b0; and (3) either the adjacent delta data set for the first original data set, $\{\Delta A1\}$, or the first original data set itself $\{a\}$.

In more detail regarding FIG. 8, first the adjacent-delta value for the members zero and one of the second original data set, $\Delta_{A2}^{1,0}$, is recovered by adding the corresponding members of the first adjacent-delta data set $\{\Delta A1\}$, and the double different data set $\{\Delta x\}$, such that $\Delta_{A2}^{1,0}=5=3+2=\Delta_{A1}^{1,0}+\Delta_x^0$. Similarly, $\Delta_{A2}^{2,1}=-4=-4+0$ and $\Delta_{A2}^{3,2}=2=2+0$. Next, the members of the second original data set $\{b\}$ are reconstructed recursively using b0 as an initial value. Member b1 is formed from adding b0 to $\Delta_{A2}^{1,0}$ such that b1=101=96+5=b0 to $\Delta_{A2}^{1,0}$. Next, b2 is formed from adding b1 to $\Delta_{A2}^{2,1}$ such that b2=97=101+(-4)=b1+$\Delta_{A2}^{2,1}$. Similarly, b3=99=97+2=b2+$\Delta_{A2}^{3,2}$.

Note that if the first original data set is stored rather than the first adjacent-delta data set, then the first adjacent delta data set must be determined from the first original data set prior to starting the reconstruction calculation.

FIG. 9 depicts in block diagram form the decoding necessary to retrieve information produced by the double-difference operation shown in FIG. 6, i.e., it is an alternative depiction of FIG. 8. The DPCM 22 receives N-bits per word data from source 1 and outputs N+1 bits per word data to an inverse DPCM 26. A distortionless or lossy data encoder 24 receives compressed data from source 2 and outputs N+2 bits per word data to the inverse DPCM 26, which outputs an N+1 bits per word signal to another inverse DPCM 28 (whose N bits per word output is the decoded data from source 2). The pre-processed band 1 data is used as an external reference input to the inverse DPCM 26. The inverse DPCM 28 requires that the first data value of band 2 be available, this first data value having been saved in the encoded data file in an appropriate format. Comparing FIG. 9 with FIG. 7, the output of the inverse DPCM 26 has the same value as the output of the DPCM 16. Item 28 executes the inverse of the process executed by item 16.

Figure 10:
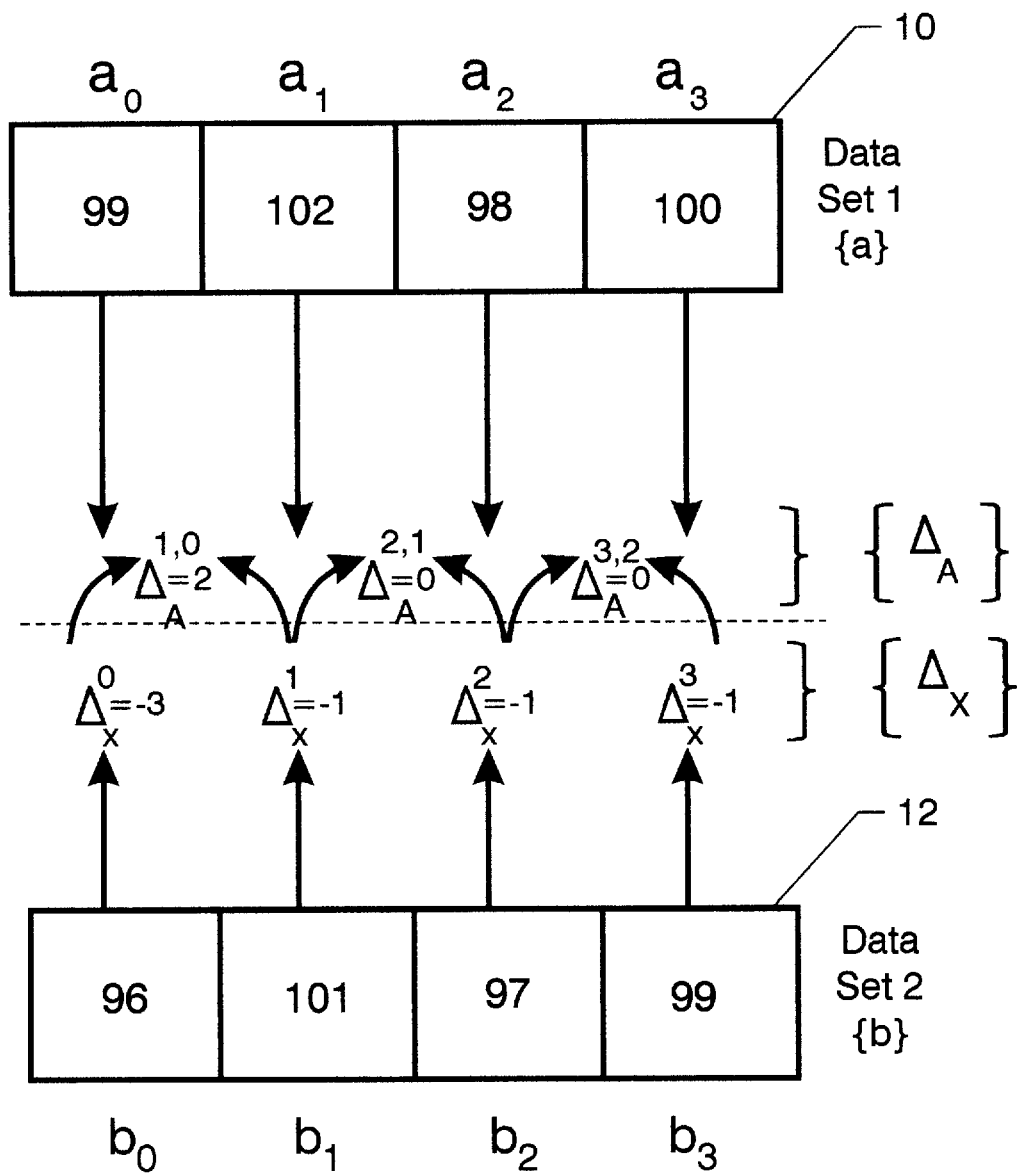
FIG. 10 depicts a double-difference calculation in the form of an adjacent-delta calculation performed on a cross-delta data set.

A second and more preferred double-difference calculation is depicted in FIG. 10. FIG. 10 shows the double-difference set being formed from, first, a cross-delta data set prepared by subtracting corresponding members of a second data set 12 from a first data set 10. Second, an adjacent-delta data set is formed by subtracting adjacent members of the cross-delta data set.

In more detail regarding FIG. 10, for the cross-delta value produced from corresponding zero$^{th}$ members of the first and second original data sets, a0 and b0, $\Delta_x^0=-3=b0-a0=96-99$. Similarly, $\Delta_x^1=-1=101-102$, $\Delta_x^2=-1=97-98$, and $\Delta_x^3=-1=99-100$. Next, for the adjacent-delta value for the members zero and one of the cross-delta data set, $\Delta_A^{1,0}=2=\Delta_x^1-\Delta_x^0=-1-(-3)$. Similarly, $\Delta_A^{2,1}=0=-1-(-1)$ and $\Delta_A^{3,2}=0=-1-(-1)$.

FIG. 11 depicts a block diagram representation of the double-difference calculation shown in FIG. 10. A DPCM 30 receives N-bits per word data from each of sources 1 and 2, respectively, and outputs N+1 bits per word data to an adjacent DPCM 32. The DPCM 30 produces a cross-delta data set. A DPCM 32 produces an N+2 bits per word adjacent-delta data set therefrom and outputs it as the double-difference data set to either a distortionless or lossy data encoder 34, which outputs the compressed source data. FIG. 11 has the advantage over FIG. 7 in that it requires only a single DPCM for the adjacent-delta data set preparation phase.

FIG. 11 and FIG. 7 produce equivalent results by relating the encoder input data samples and the input source data in the figures, respectively. Let a0, a1, . . . and b0, b1, b2, . . . be original data sets from source 1 and 2, respectively. The first level of DPCM (i.e., DPCM's 14 and 16) in FIG. 7 will produce, respectively, the values of (a1–a0), (a2–a1), (a3–a2), . . . for source 1 (1)
(b1–b0), (b2–b1), (b3–b2), for source 2 (2)

The second level of DPCM in FIG. 7 (i.e., DPCM 18) will produce the data sequence to be coded by the following data coder:

(b1–b0)–(a1–a0),(b2–b1)–(a2–a1),(b3–b2)–(a3–a2), . . . (3)

The data sequence can be written as (b1–a1)–(b0–a0),(b2–a2)–(b1–a1),(b3–a3)–(b2–a2), . . . (4)

which can also be obtained by the DPCM 30 first taking the difference of data from sources 1 and 2 (to produce a cross-delta data set), as FIG. 11 depicts, to give:

(b0–a0), (b1–a1), (b2–a2), . . . (5)

followed by the DPCM 32 operating on a previous data value from this cross-delta data set, or data sequence to produce an adjacent-delta data set.

Figure 12:
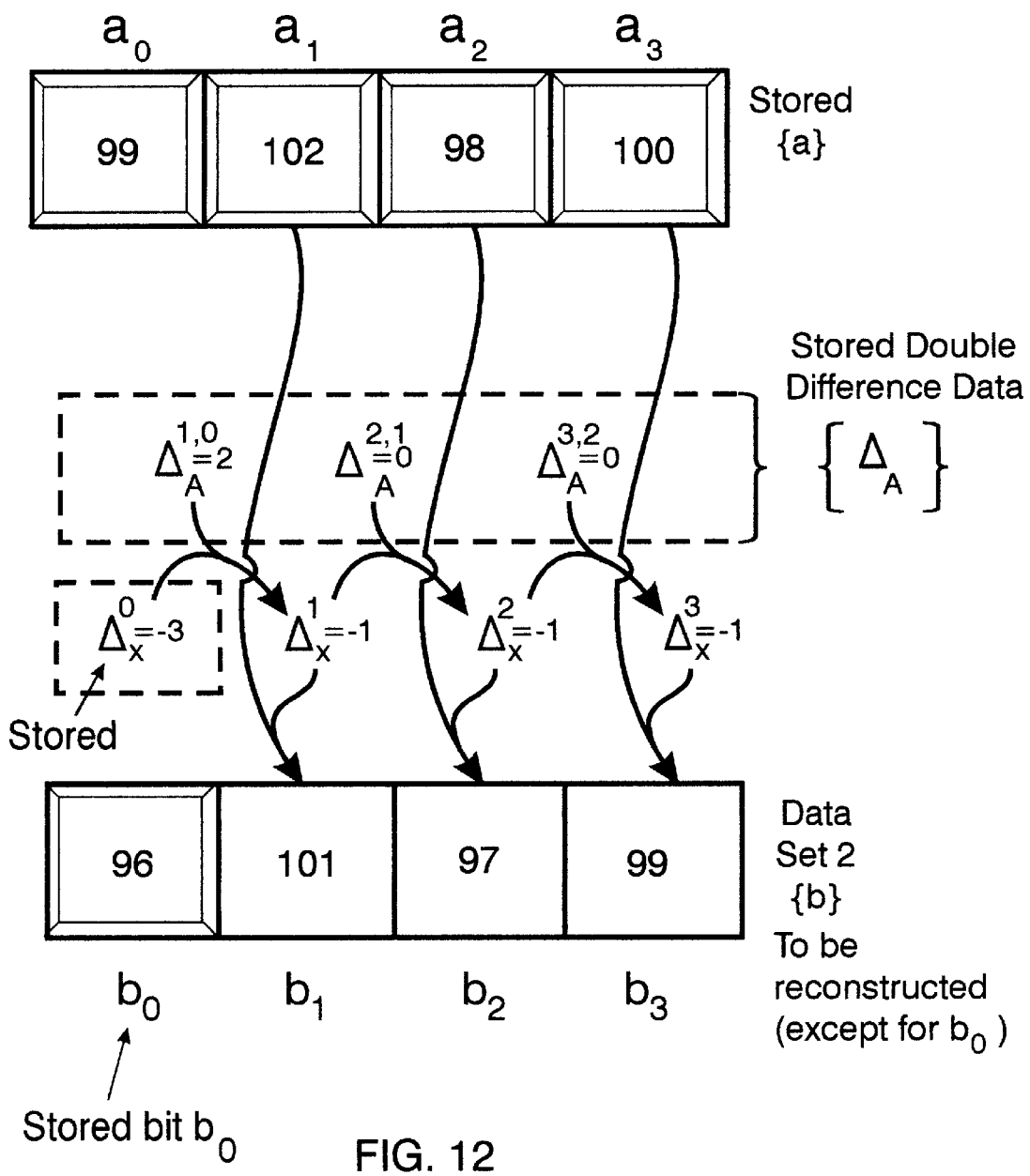
FIG. 12 is a reconstruction calculation, i.e., the inverse calculation to the double-difference calculation depicted in FIG. 10.

FIG. 12 depicts a reconstruction calculation, i.e., the inverse calculation to the double-difference calculation depicted in FIG. 10, that reconstructs the second original data set. Certain information is stored after the double difference calculation of FIG. 10 is completed: (1) the double-difference data set, $\{\Delta A\}$; (2) the zero$^{th}$ member of the cross-delta data set, $\Delta_x^0$; and (3) the first original data set, $\{a\}$.

In more detail regarding FIG. 12, the members of the cross-delta data set $\{\Delta x\}$ are recovered recursively using the zero$^{th}$ member of the cross-delta data set, $\Delta_x^0$, as an initial value. Member $\Delta_x^1$ is formed by adding $\Delta_x^0$ to $\Delta_A^{1,0}$ such that $\Delta_x^1=-1=\Delta_x^0+\Delta_A^{1,0}=-3+2$. Next, $\Delta_x^2$ is formed by adding $\Delta_x^1$ to $\Delta_A^{2,1}$ such that $\Delta_x^2=-1=\Delta_x^{2,1}=-1+0$. Similarly, $\Delta_x^3=-1=\Delta_x^2+\Delta_A^{3,2}=-1+0$. Next, the members of the second original data set are $\{b\}$ are reconstructed by adding corresponding members of the cross-delta data set, $\{\Delta x\}$, and the first original data set, $\{a\}$, respectively, such that $b_1 101=-1+102=\Delta_x^1+a_1$, $b_2=97=-1+98=\Delta_x^2+a_2$, and $b_3 99=-1+100=\Delta_x^3+a_3$.

FIG. 13 depicts the decoding scheme for use with the double-difference data produced by FIG. 10, i.e., it is an alternative depiction of FIG. 12. FIG. 13 produces an equivalent result to that produced by FIG. 9. A distortionless or lossy data decoder 36 receives encoded source 2 data and outputs a signal to a first inverse DPCM 38 which outputs a signal to a second inverse DPCM 40. N-bit data from source 1 is also input to the inverse DPCM 40, which then outputs decoded source 2 data.

A variety of distortionless source encoding/decoding techniques can be employed for the entropy coder/decoder. One that works particularly well on imaging and science data is the Rice algorithm (R. F. Rice, "Some practical universal noiseless coding techniques," JPL pub. 79–22, 1979, hereby incorporated by reference). This algorithm has pre-processing and entropy coding. The pre-processing performs data prediction on N-bit input data samples and mapping that maps the (N+1)-bit data samples back to all non-negative N-bit data. The entropy coding itself is a collection of discrete Huffman codings, each optimal for a particular entropy range. It adapts to the data information rate by selecting the Huffman code option that gives the shortest codeword length for an input sample block of a fixed number of samples, such as 8 or 16. If the Rice algorithm is used to implement the data encoding, one can make use of the DPCM pre-processing in the algorithm as, for example, the second stage DPCM 32 in FIG. 11. Such implementation would then only require a DPCM as an external pre-processor.

Figure 14:
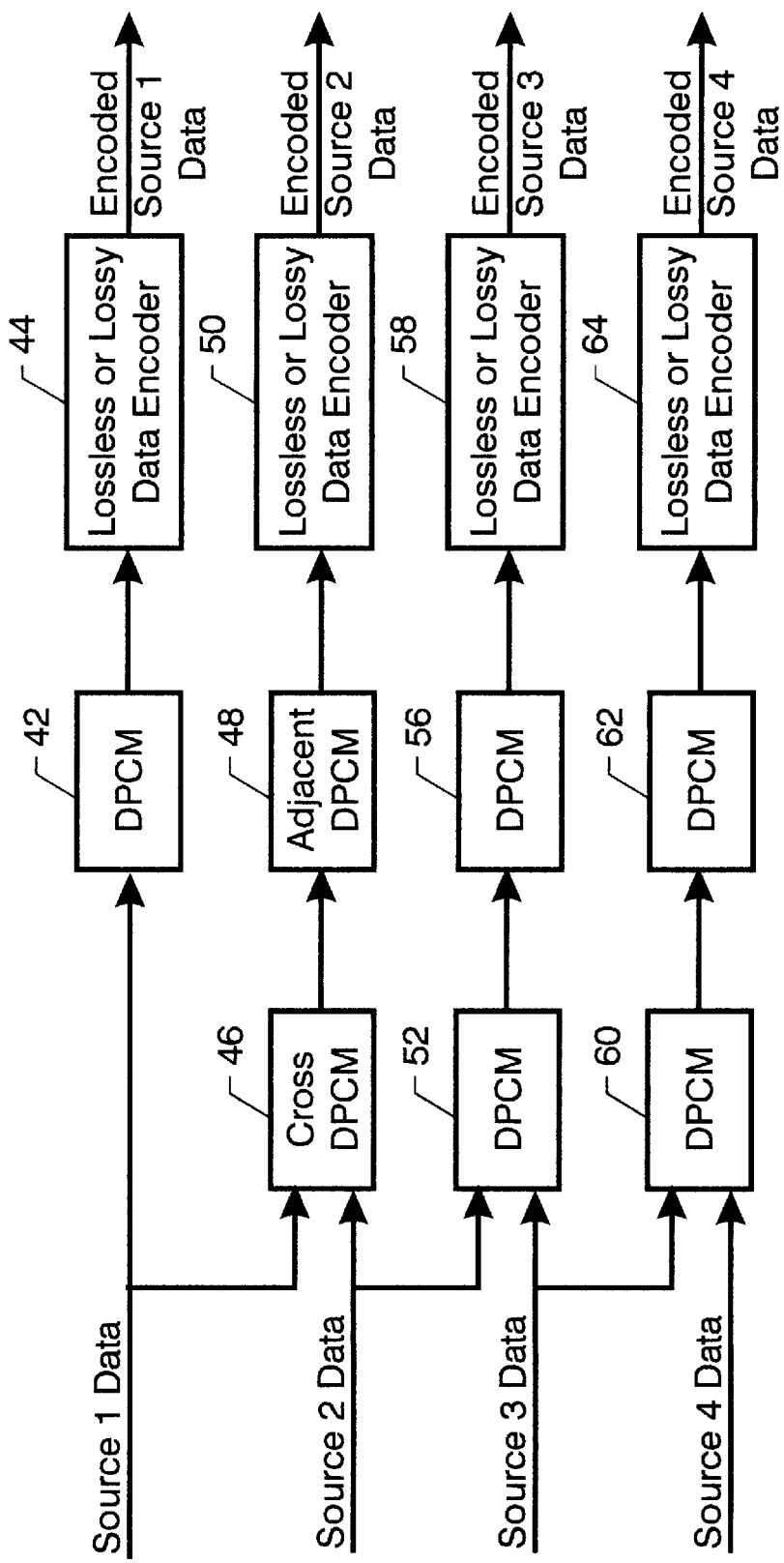
FIG. 14 is a depiction of the double-difference calculation according to the present invention for three or more data sources.
Figure 15:
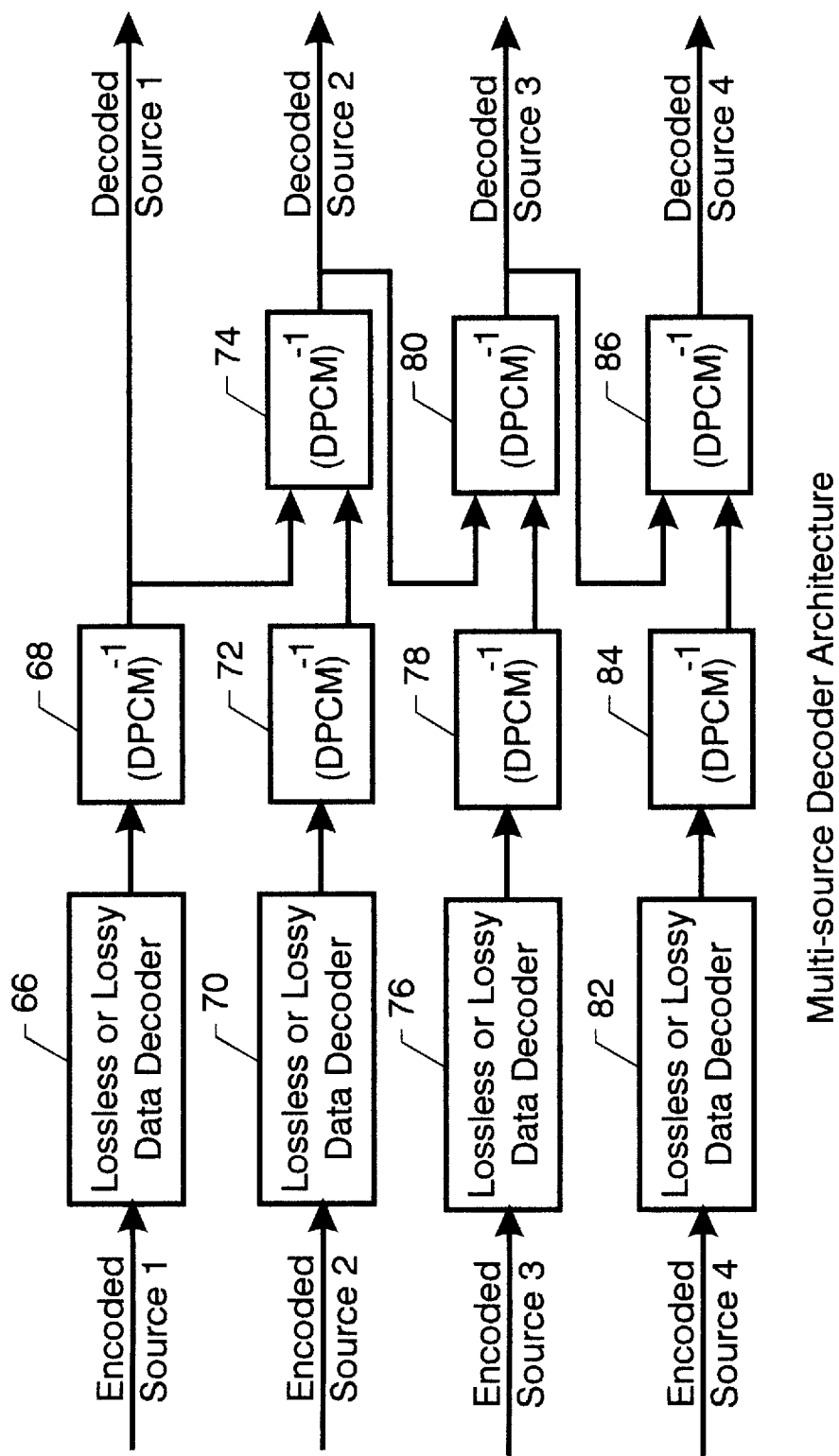
FIG. 15 is the inverse or reconstruction calculation to the at-least-three data source pre-coding double-difference calculation depicted in FIG. 14.

For encoding and decoding more than two sources, an architecture which builds on the basic block diagram in FIG. 11 can be used. One data source, such as spectral band 1, should be compressed without cross-band information and the other bands will use an adjacent band as a reference in the DPCM pre-processing. This architecture for up to 4 data sources is given in FIGS. 14 and 15 (the associated inverse technique).

Figure 16:
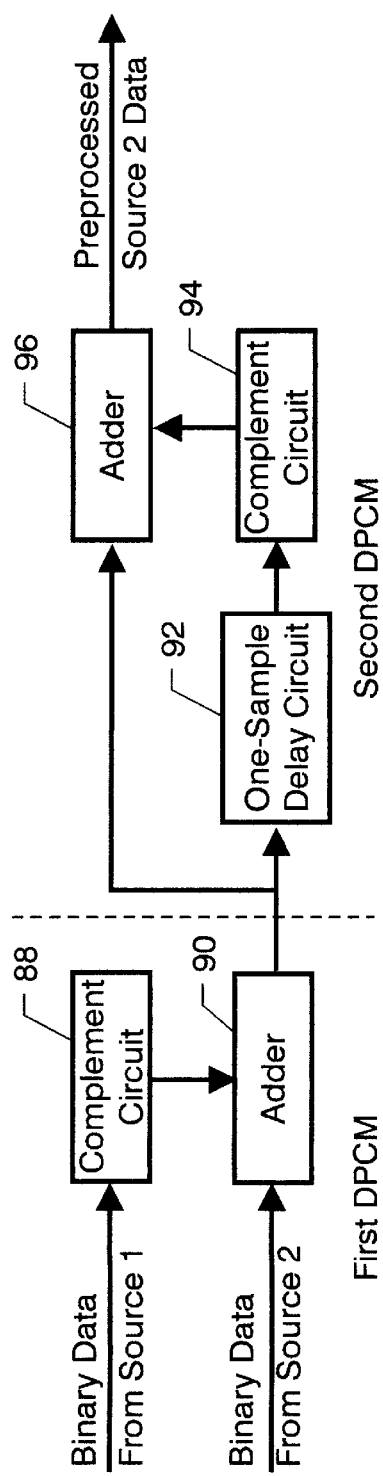
FIG. 16 depicts the preferred hardware embodiment for the double-difference calculator of the present invention.

The preferred hardware embodiment of the preferred type of double-difference calculation (cross-adjacent) is depicted in FIG. 16. An arithmetic complement device 88 receives data from source 1 and outputs the complement thereof to adder 90, which also receives data from source 2. The adder 90 outputs its sum, i.e., a cross-delta data set, to an adder 96 and a one-sample delay circuit 92, which outputs the delayed cross-delta data set to an arithmetic complement device 94. The complement device 94 outputs the complement of the delayed cross-delta data set to the adder 96, and the adder 96 outputs an adjacent-delta, i.e., double-difference data set. FIG. 16 is drawn with the assumption that the discrete electronic structures introduce no significant delay by their operation, hence the delay circuit 92 has been included.

The complement device 88 and the adder 90 represent a first stage DPCM processor while the one sample delay buffer 92, the complement device 94, and the adder 96 represent a second DPCM processor stage. The first DPCM processor stage has two data inputs, one being used as a reference input. The input data can be in 1's or 2's complement arithmetic integer numbers.

Figure 17:
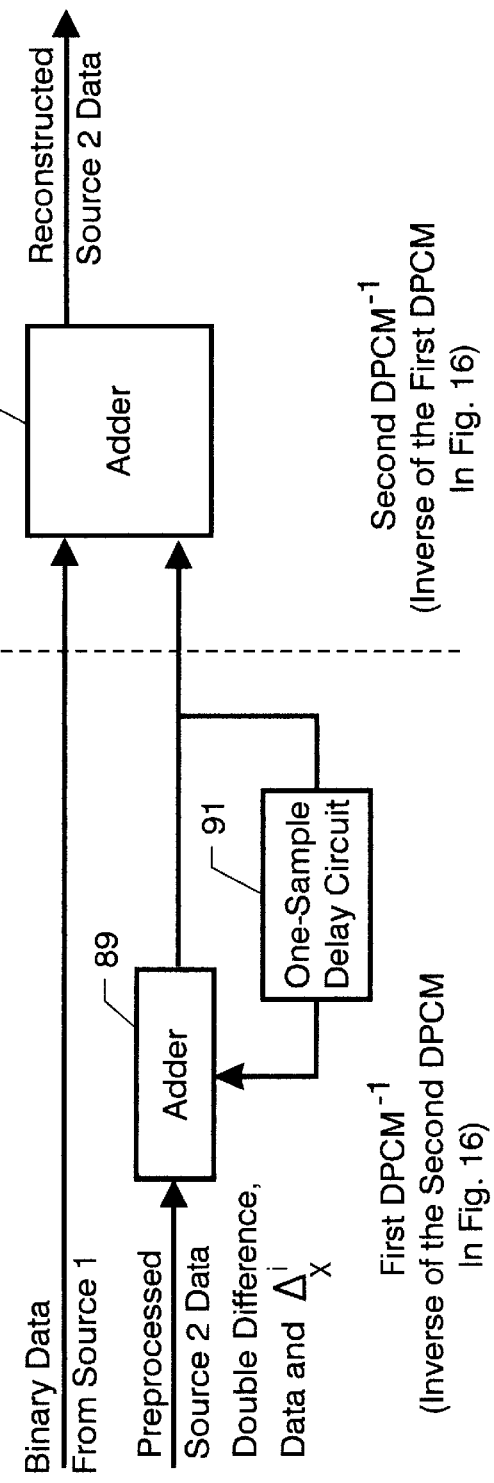
FIG. 17 depicts the preferred hardware embodiment for the reconstruction calculator of the present invention.

FIG. 17 depicts the preferred hardware embodiment for the reconstruction calculator of the present invention corresponding to the reconstruction calculation depicted in FIG. 12. In decoding, the inverse DPCM processor is implemented using the same logic in the encoder except that the complement circuit is no longer needed. A first adder 89 receives the stored preprocessed data from source 2, i.e., the cross-adjacent double difference data set. The output of the adder 89 is connected to a one sample delay circuit 91 and a second adder 93. The one-sample delay circuit 91 delays the output of the adder 89 and inputs it back into the adder 89. The adder 93 also receives the original data set from source 1, uses it as a reference, and outputs the reconstructed second original data set. FIG. 17 is drawn with the assumption that the discrete electronic structures introduce no significant delay by their operation, hence the delay circuit 91 has been included.

Figure 18:
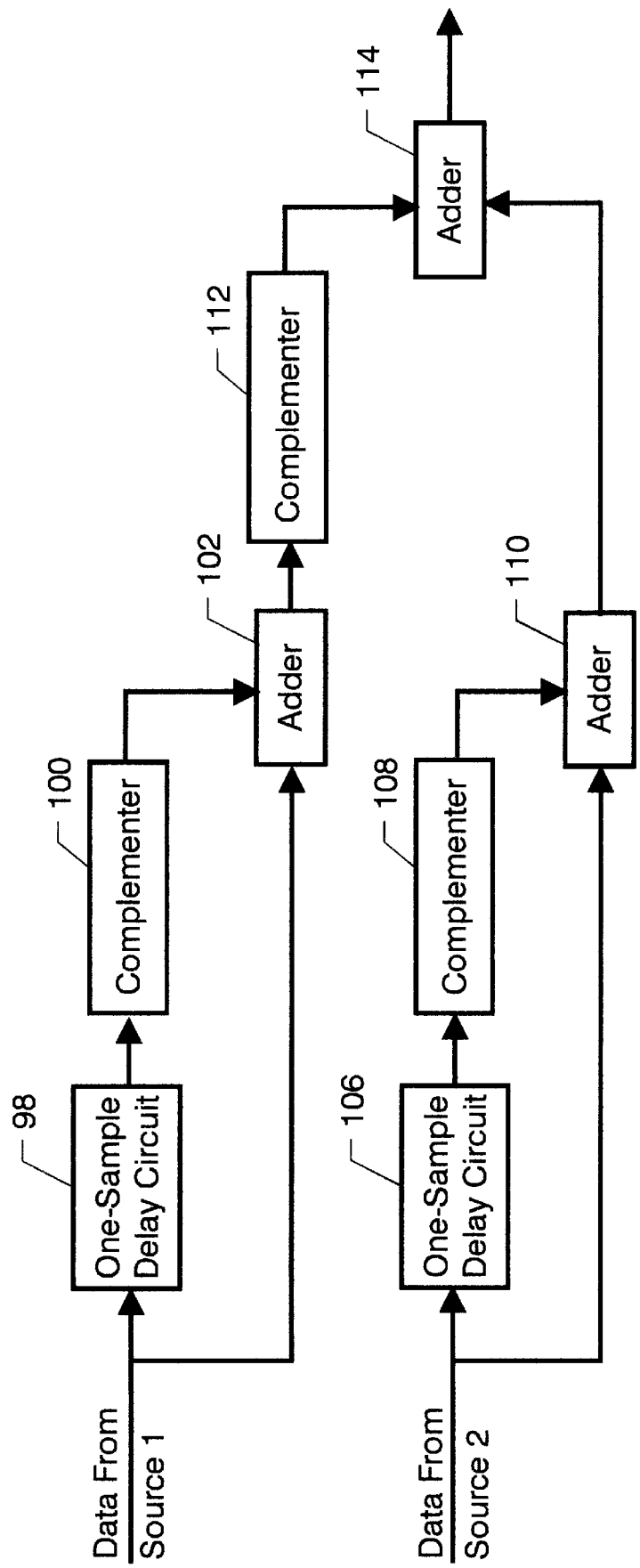
FIG. 18 depicts an alternative hardware embodiment for the double-difference calculator of the present application.

A hardware embodiment for the second preferred double-difference calculation, adjacent-cross, is shown in FIG. 18. A one sample delay circuit 98 receives data from source 1 and outputs the delayed original sourced data to the complementer 100. The complementer 100 outputs a signal to an adder 102. The adder 102 also receives the original data from source 1 and outputs an adjacent-delta data set to another complementer 112. A second one-sample delay circuit 106 receives data from source 2 and outputs the delayed original source 2 data to a complementer 108. The complementer 108 outputs a signal to a second adder 110. The adder 110 also receives the original source 2 data and outputs an adjacent-delta data set to a third adder 114. The third adder 114 also receives a signal from the complementer 112 and outputs a cross-delta double-difference data set. FIG. 18 is drawn under the assumption, discussed above, that any significant delays must be indicated, hence the inclusion of the delay circuits 98 and 106.

Figure 19:
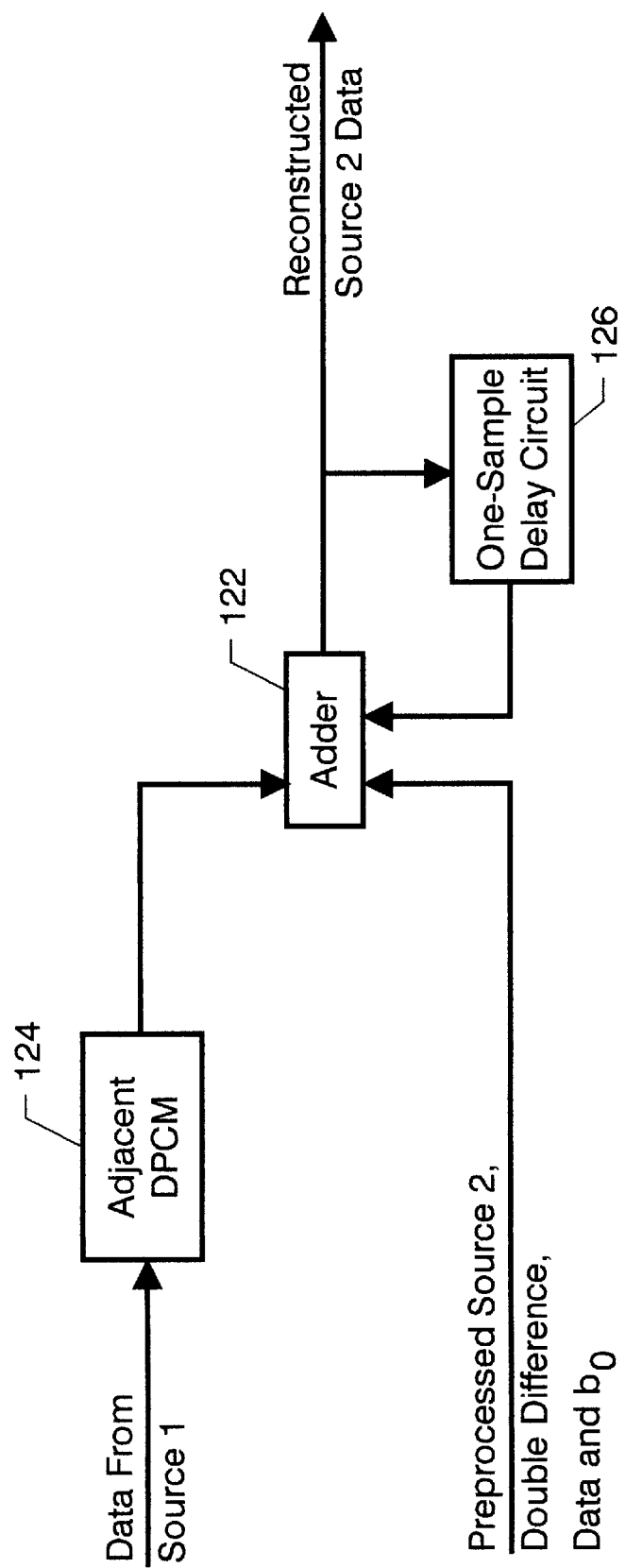
FIG. 19 depicts an alternative hardware embodiment of the reconstruction calculator of the present invention.

FIG. 19 depicts an alternative hardware embodiment of the reconstruction calculator of the present invention corresponding to the calculation depicted in FIG. 8. The stored preprocessed, i.e., adjacent-cross double difference, data is input to an adder 122. The stored original data from source 1 is passed through a DPCM 124 (see FIG. 18 items 98, 100, and 102 for a discrete hardware equivalent thereof). A one sample delay circuit delays the output of the adder 122 and inputs it back into the adder 122. In addition, the adder 122 receives a signal from the DPCM 124. Again, FIG. 19 is drawn under the assumption, discussed above, that any significant delays must be indicated, hence the inclusion of the delay circuit 126.

The discrete electronic structures shown in FIGS. 16–19 can be realized with well-known analog or digital hardware components using either custom or standard practice design methodologies or can be implemented on a single integrated circuit. For lossless data encoding implementation of the double-difference data sets, the data compression hardware is well known and readily available. The embodiments of the present application can be implemented as an additional module in lossless data compression hardware, and thereby be incorporated in lossless data compression chips.

Figure 20:
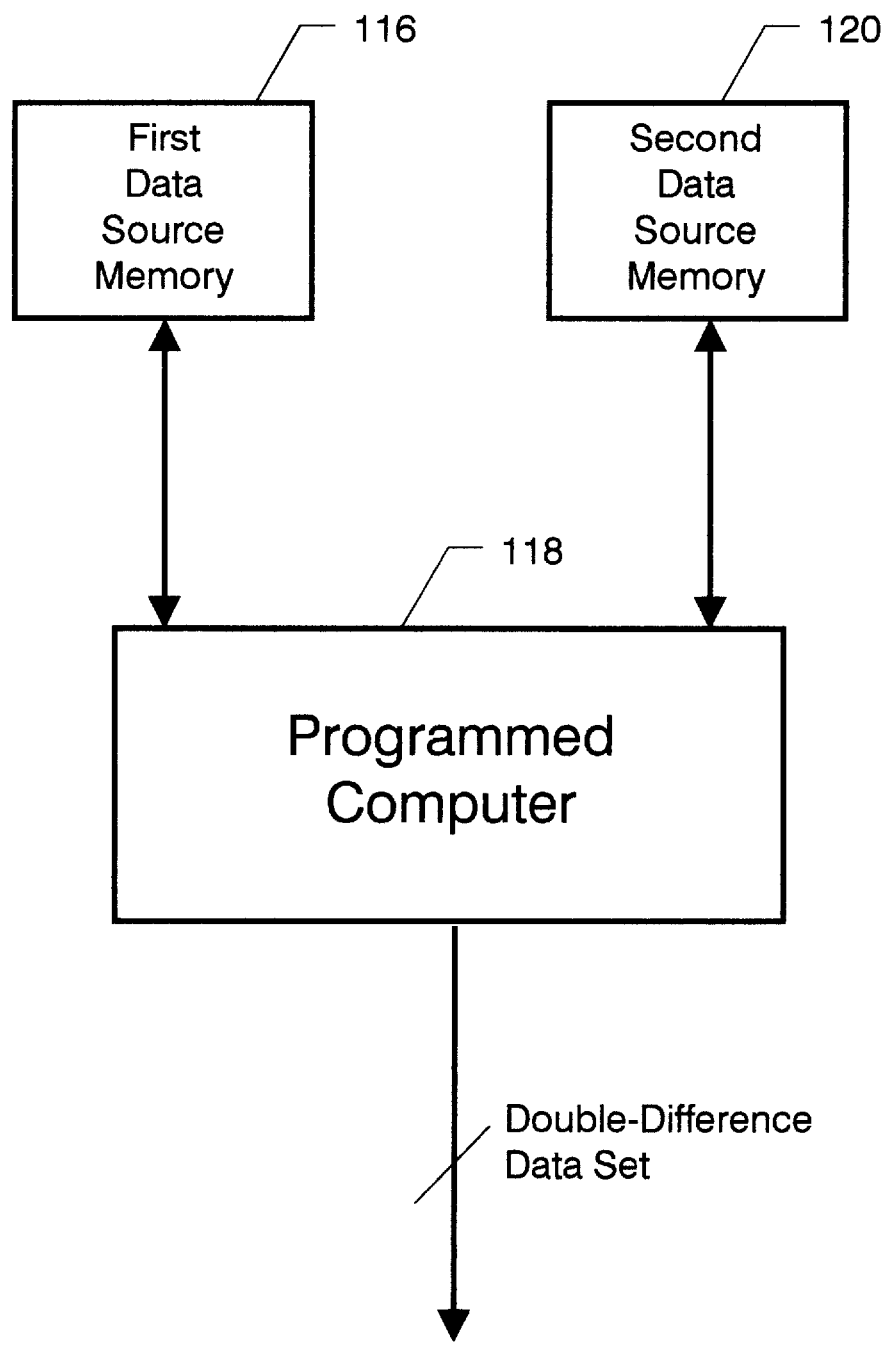
FIG. 20 depicts a programmed computer embodiment of the double-difference calculator of the present application.

FIG. 20 depicts a further hardware embodiment of either of the double-difference methods discussed above. A programmed computer 118 receives data from a data source 116 and different data from a data source 120 and outputs a double-difference data set. As supported by the discussion above, the first data source 116 could be a piece of hardware discrete from the second data source 120, or it could represent the same single piece of hardware that produced a first and second original data set at different points in time, respectively. Based upon the discussion above, one of ordinary skill in the art could write a program to implement the double-difference calculation without enduring undue experimentation for the sake of brevity, further discussion of this point is omitted.

Figure 21:
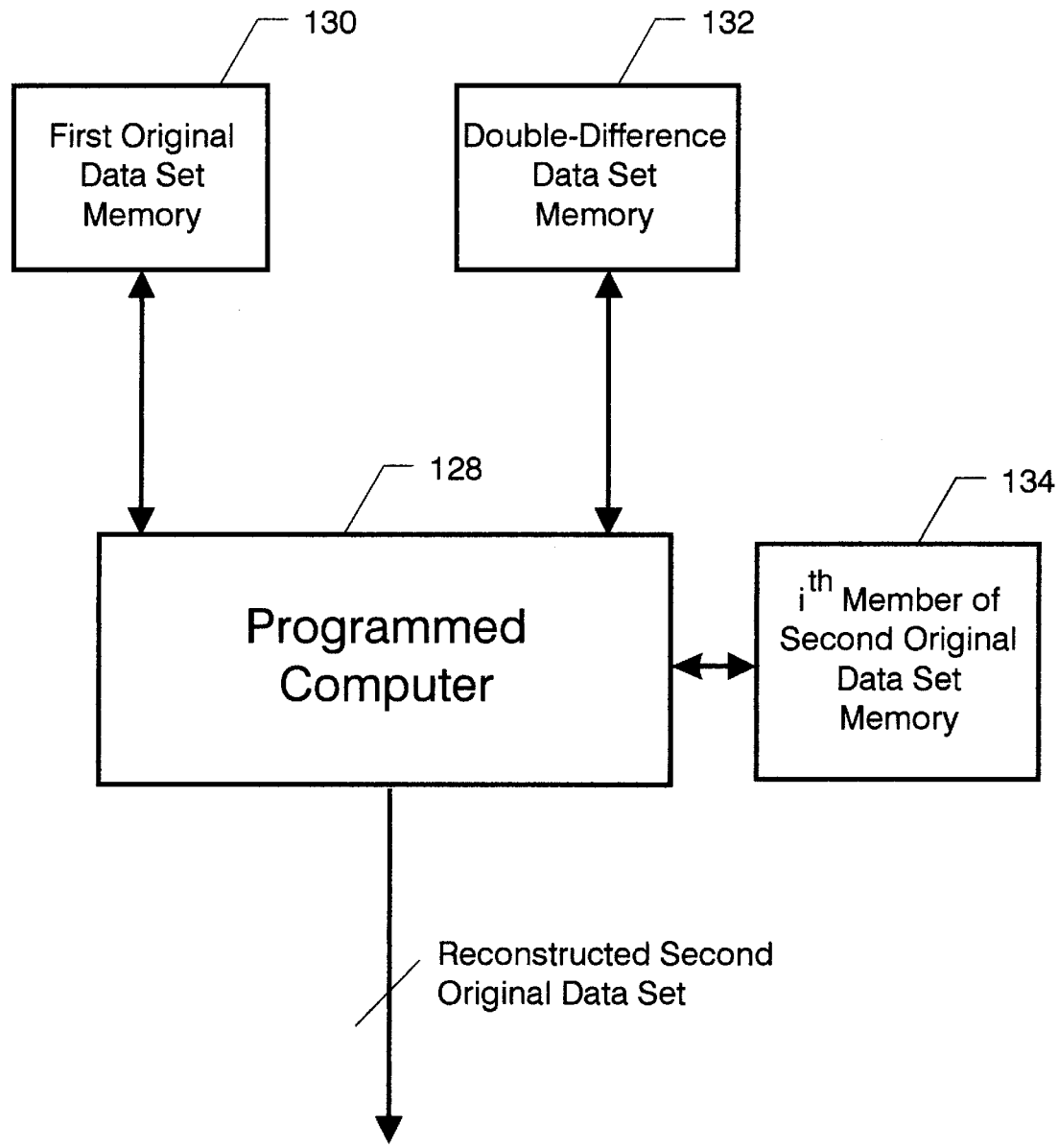
FIG. 21 depicts a programmed computer embodiment of the reconstruction calculator of the present application.

FIG. 21 depicts a further hardware embodiment of either of the reconstruction calculations discussed above. A programmed computer 128: receives a first original data set (or its corresponding first adjacent-delta data set) from memory 130; receives a double difference data set from memory 132; and optionally receives an $(i-1)^{th}$ member of the second original data set (i.e., the one to be reconstructed) from memory 134, depending on the type of reconstruction being performed. Again, given the ordinary level of skill in the art, further discussion on this point is omitted.

Figure 1:
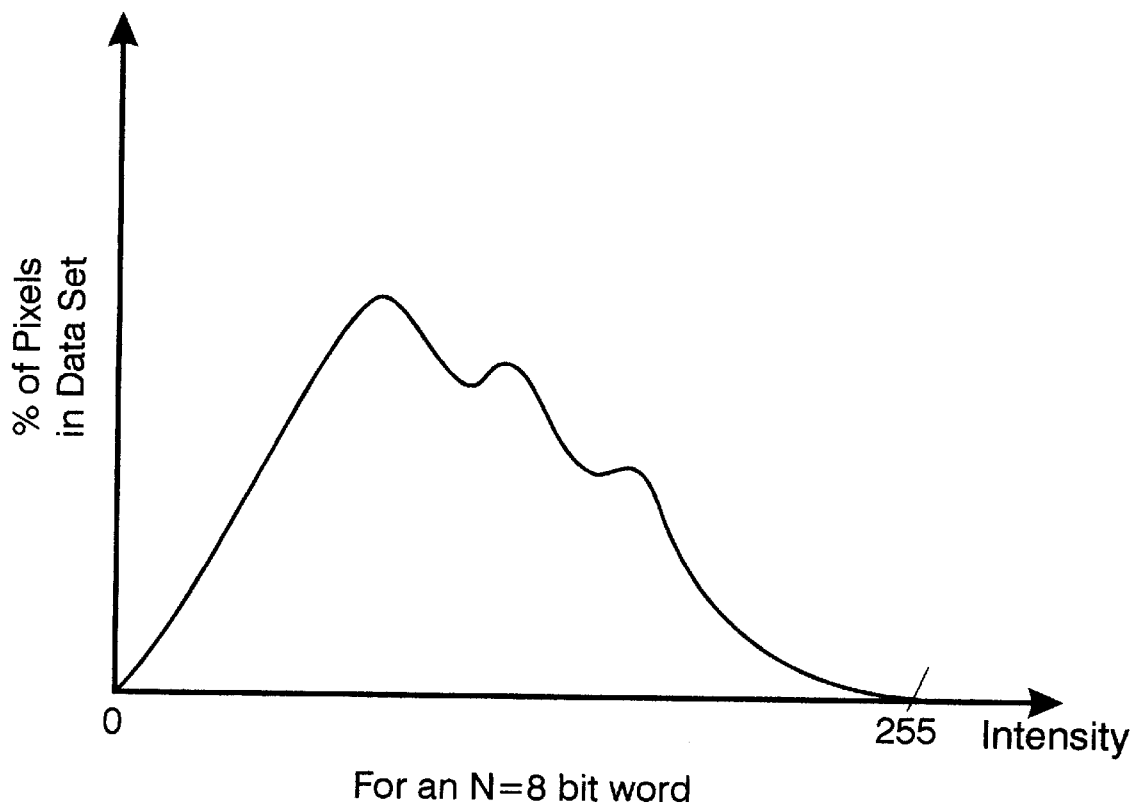
FIG. 1 depicts a typical distribution of intensity values for pixels represented by an 8-bit word.
Figure 2:
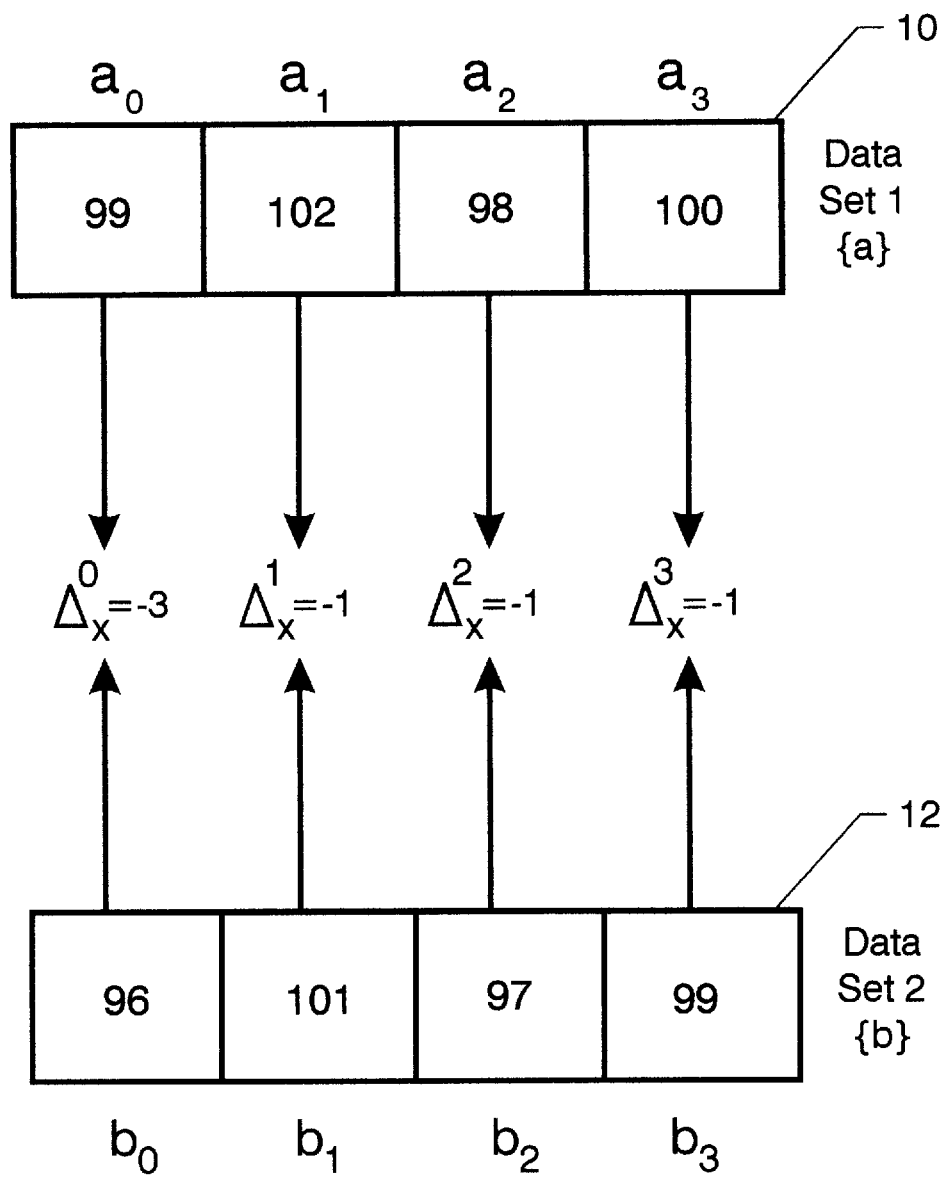
FIG. 2 depicts a cross-delta single difference calculation.
Figure 3:
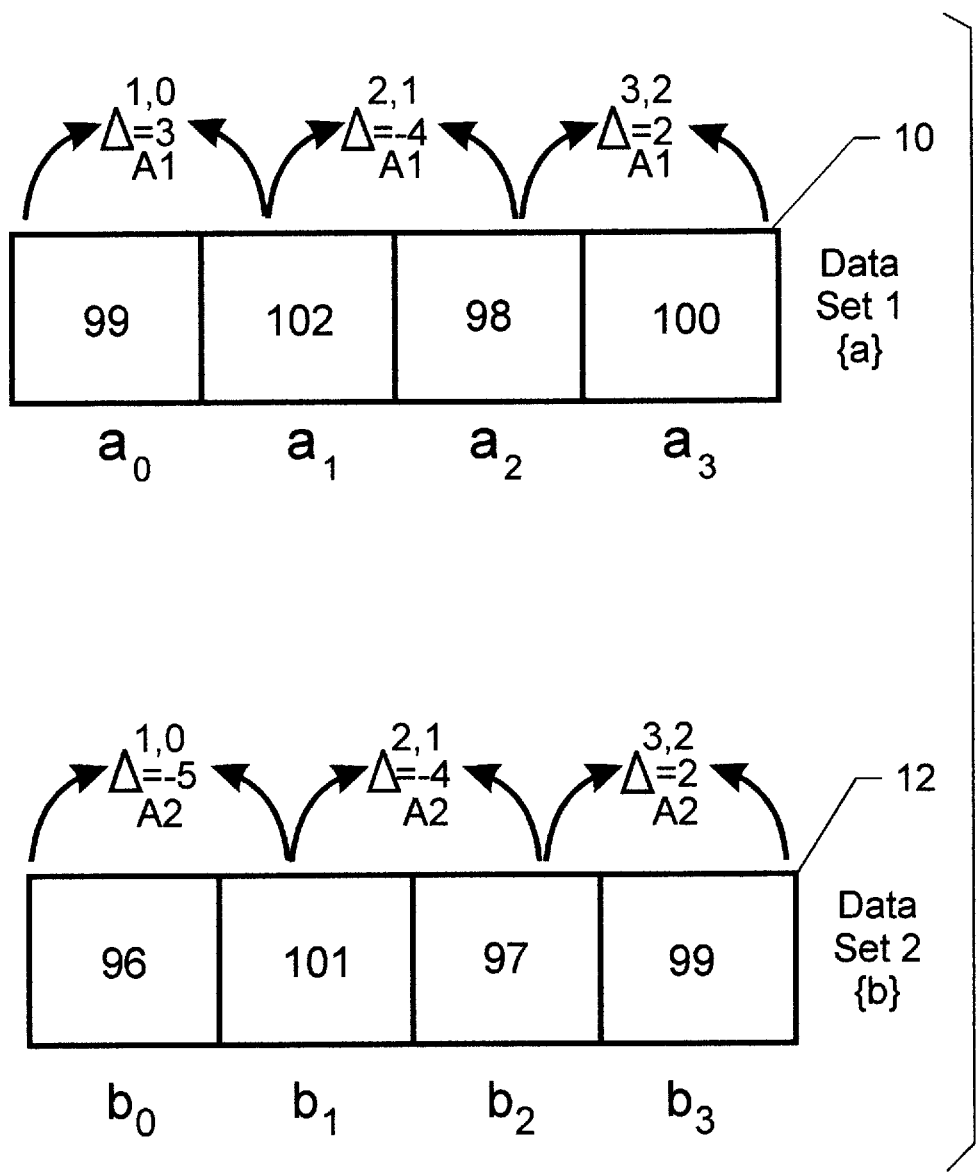
FIG. 3 depicts an adjacent-delta single difference calculation.
Figure 4:
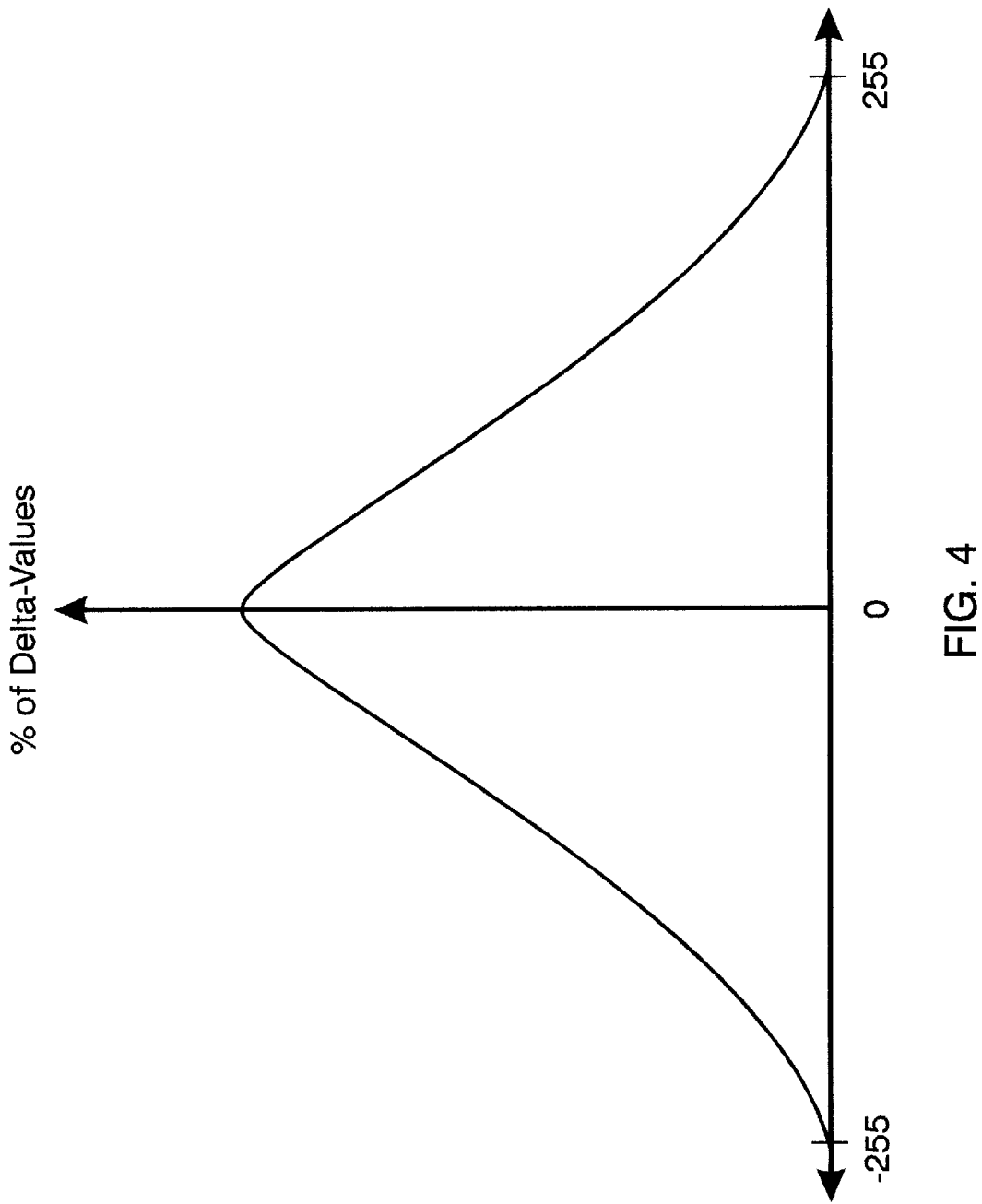
FIG. 4 depicts a typical distribution of delta-values for pixels represented by an 8-bit word when only a single difference pre-coding scheme is used.
Figure 5:
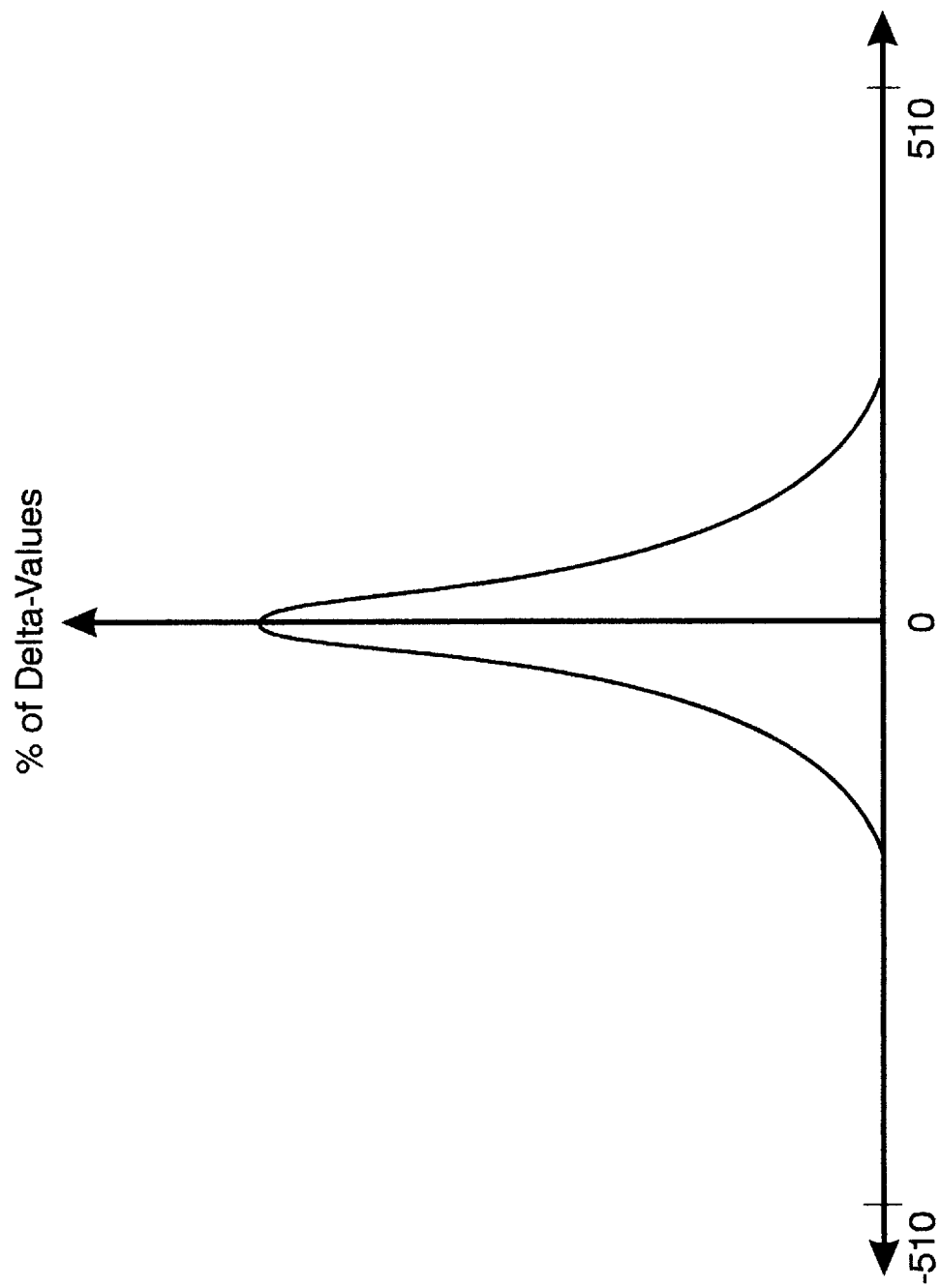
FIG. 5 depicts a more narrow distribution of delta-values for representation of a pixel by an 8-bit word that results when the double-difference pre-coding method of the present application is applied.

In contrast to the prior art, as depicted for example in FIG. 5, the presently disclosed double-difference methods produce delta-value distributions that are not widely dispersed. This is reflected in the result that such double-difference data sets achieve compression ratios exceeding those that can be achieved using only a single set of original data.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim the following:

1. A pre-coding apparatus to improve data compression performance by removing correlation between a first original data set and a second original data set each having M members, respectively, via an adjacent-cross double difference calculation, the apparatus comprising:

a first complementer for arithmetically complementing the first original data set;

a first adder, responsive to the first complementer, for adding the first original data set and its complement to form a first adjacent-delta data set;

a second complementer for arithmetically complementing the second original data set;

a second adder, responsive to the second complementer, for adding the second original data set and its complement to form a second adjacent-delta data set;

a third complementer, responsive to the first adder, for arithmetically complementing the first adjacent-delta data set; and a third adder, responsive to the second adder and the third complementer, for adding the second adjacent-delta data set and the complement of the first adjacent-delta data set, to form a compression-efficiency-enhancing, cross-delta, double-difference data set, for subsequent compression coding.

2. An apparatus as in claim 1, wherein:

the first and second original data sets have N-bits per member, respectively;

the first and second adjacent-delta data sets have N+1 bits per member; and the double-difference set has N+2 bits per member.

3. An apparatus as in claim 1, further comprising:

a first one sample delay circuit for delaying the first original data set prior to its input into the first complementer; and a second one sample delay circuit for delaying the second original data set prior to its input into the second complementer.

4. A pre-coding apparatus to improve data compression performance by removing correlation between a first original data set and a second original data set each having M members, respectively, via a cross-adjacent double difference calculation, the apparatus comprising:

a first complementer for arithmetically complementing the first original data set;

a first adder, responsive to the first complementer, for adding the second original data set and the complement of the first original data set to form a cross-delta data set;

a second complementer, responsive to the first adder, for arithmetically complementing the cross-delta data set;

a second adder, responsive to the first adder and the second complementer, for adding the cross-delta data set and the complement of the cross-delta data set, to form a compression-efficiency-enhancing, adjacent-delta, double-difference data set, for subsequent compression coding.

5. An apparatus as in claim 4, wherein:

the first and second original data sets have N-bits per member, respectively;

the first and second cross-delta data sets have N+1 bits per member; and the double-difference set has N+2 bits per member.

6. An apparatus as in claim 4, further comprising:

a first one sample delay circuit for delaying the cross-delta data set prior to its input to the second complementer.

7. A restoration calculator for reconstructing a second original data set from a stored cross-adjacent double difference data set, an $i^{th}$ member of a cross-delta data set, and a first original data set, the apparatus comprising:

a first adder receiving the $i^{th}$ member of the cross-delta data set and the cross-adjacent double difference data set;

a one sample delay circuit for delaying the output of the first adder and feeding it back to the first adder; and a second adder for receiving the first original data set and the output of the first adder, the second adder outputting a reconstructed second original data set.

8. A restoration calculator for reconstructing a second original data set from a stored adjacent-cross double difference data set, an $i^{th}$ member of the second original data set, and a first original data set, the apparatus comprising:

a complementer for arithmetically complementing the first original data set;

a first adder, responsive to the complementer, for adding the first original data set and the complement of the first original data set;

a second adder, responsive to the first adder, for adding an output of the first adder, the stored adjacent-cross double difference data set, and an $i^{th}$ member of the second original data set; and a first one sample delay circuit, responsive to the second adder, for delaying the output of the second adder and feeding it back to the second adder, the second adder outputting a reconstructed second original data set.

9. An apparatus as in claim 8, further comprising:

a second one sample delay circuit for delaying the first original data set prior to its input to the complementer.

* * * * *